(12) United States Patent
Lan et al.

(10) Patent No.: US 9,300,311 B2
(45) Date of Patent: Mar. 29, 2016

(54) DYNAMIC ELEMENT MATCHING METHODS AND APPARATUSES

(71) Applicant: Amlogic Co., Ltd., Santa Clara, CA (US)

(72) Inventors: Jinbao Lan, Chongqing (CN); Haihong Zhao, Beijing (CN); Yong Zhang, Beijing (CN); Ming Shi, Shanghai (CN); Shu-Sun Yu, Cupertino, CA (US); Chieh-Yuan Chao, Fremont, CA (US)

(73) Assignee: Amlogic Co., Ltd., Santa Clara, CA (US)

( * ) Notice: Subject to any disclaimer, the term of this patent is extended or adjusted under 35 U.S.C. 154(b) by 0 days.

(21) Appl. No.: 14/243,852

(22) Filed: Apr. 2, 2014

(65) Prior Publication Data

US 2015/0288374 A1 Oct. 8, 2015

(51) Int. Cl.
*H03M 1/06* (2006.01)
*H03M 1/74* (2006.01)
*H03M 3/00* (2006.01)

(52) U.S. Cl.
CPC .......... *H03M 1/0668* (2013.01); *H03M 1/0626* (2013.01); *H03M 1/74* (2013.01); *H03M 3/50* (2013.01)

(58) Field of Classification Search
CPC ......... H03M 1/66; H03M 1/067; H03M 1/74; H03M 1/747; H03M 1/0665; H03M 1/0663; H03M 1/0668; H03M 1/361; H03M 3/50; H03M 3/464; H03M 3/424; H03M 3/458; H03M 3/502; H03M 3/452; H03M 3/35
USPC .................................. 341/118–144; 375/252
See application file for complete search history.

(56) References Cited

U.S. PATENT DOCUMENTS

| | | | |
|---|---|---|---|
| 6,304,608 B1 * | 10/2001 | Chen et al. ..................... | 375/252 |
| 6,384,761 B1 * | 5/2002 | Melanson ..................... | 341/143 |
| 7,119,725 B1 * | 10/2006 | Shih ............................... | 341/143 |
| 7,183,955 B1 * | 2/2007 | Shih ............................... | 341/143 |
| 7,982,648 B2 * | 7/2011 | Chen ............................. | 341/143 |
| 2003/0085827 A1 * | 5/2003 | Koifman et al. .............. | 341/144 |
| 2007/0241950 A1 * | 10/2007 | Petilli et al. .................. | 341/143 |
| 2007/0252743 A1 * | 11/2007 | Ido et al. ...................... | 341/155 |
| 2014/0152480 A1 * | 6/2014 | Nguyen et al. ................ | 341/144 |

* cited by examiner

*Primary Examiner* — Lam T Mai
(74) *Attorney, Agent, or Firm* — Venture Pacific Law, PC (57) ABSTRACT

A dynamic element matching method for a multi-unit-element digital-to-analog converter having unit elements comprises several steps. An element selection probability is determined as a function of a number of the unit elements and a digital signal. Next, loop filter output signals are generated as a function of the determined element selection probability and control signals for the unit elements. Certain ones of the unit elements are selected as a function of the generated loop filter output signals. The selected certain ones of the unit elements are activated for output of the converter.

20 Claims, 6 Drawing Sheets

DYNAMIC ELEMENT MATCHING METHODS AND APPARATUSES

FIELD OF INVENTION

The disclosure relates to data converters, and, more particularly, to methods and apparatuses for dynamic element matching in sigma-delta data converters.

BACKGROUND

Currently, multi-bit sigma-delta data converters, including multi-bit sigma-delta analog-to-digital converters ("multi-bit SD-ADCs") and multi-bit sigma-delta digital-to-analog converters ("multi-bit SD-DACs") are widely used for high performance audio applications. The primary reason is that multi-bit SD-ADCs and multi-bit SD-DACs can achieve a targeted dynamic range of about 96 dB or more by utilizing design techniques of oversampling, quantization noise shaping, and element mismatch shaping without having strict device matching requirements or having costly post-fabrication trimming processes. Typically, multi-bit SD-ADCs and multi-bit SD-DACs rely on dynamic element matching ("DEM") techniques to overcome in-band signal-dependent tones and down-folded quantization noise incurred from device mismatches.

Figure 1:
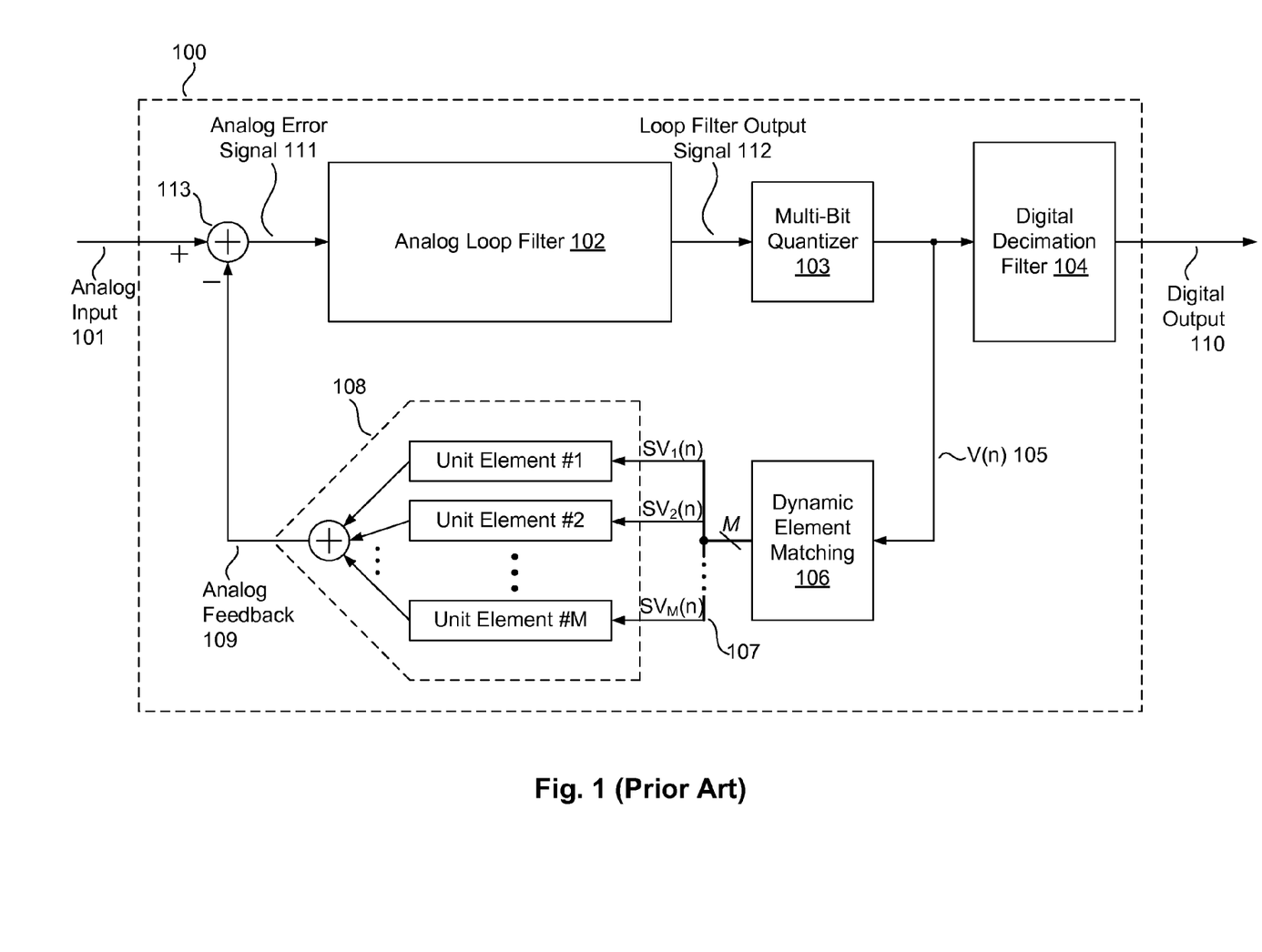
FIG. 1 illustrates a block diagram of a prior art multi-bit SD-ADC employing a multi-unit-element DAC.

FIG. 1 illustrates a block diagram of a multi-bit SD-ADC of the prior art. A multi-bit SD-ADC 100 converts an analog input signal 101 into a digital output signal 110. The multi-bit SD ADC 100 comprises an adder 113, an analog loop filter 102, a multi-bit quantizer 103, a digital decimation filter 104, a dynamic element matching block 106, and a multi-unit-element DAC 108. The multi-bit SD-ADC 100 oversamples its analog input signal 101 at a predefined oversampling ratio ("OSR"), and then subtracts an analog feedback signal 109 from the sampled analog input signal to generate an analog error signal 111. The analog error signal 111 is filtered by the analog loop filter 102 of a predefined order to generate a loop filter output signal 112, which is then quantized by the multi-bit quantizer 103 of (M+1) levels, where M is an integer greater than or equal to two. The quantizer 103 generates an oversampled digital signal V(n) 105. The digital decimation filter 104 of a decimation factor equal to said OSR decimates the oversampled digital signal V(n) 105 to generate the digital output signal 110 of the SD-ADC 100. The combination of the dynamic element matching circuit 106 and the multi-unit-element DAC 108 converts the oversampled digital signal V(n) 105 into the analog feedback signal 109.

Figure 2:
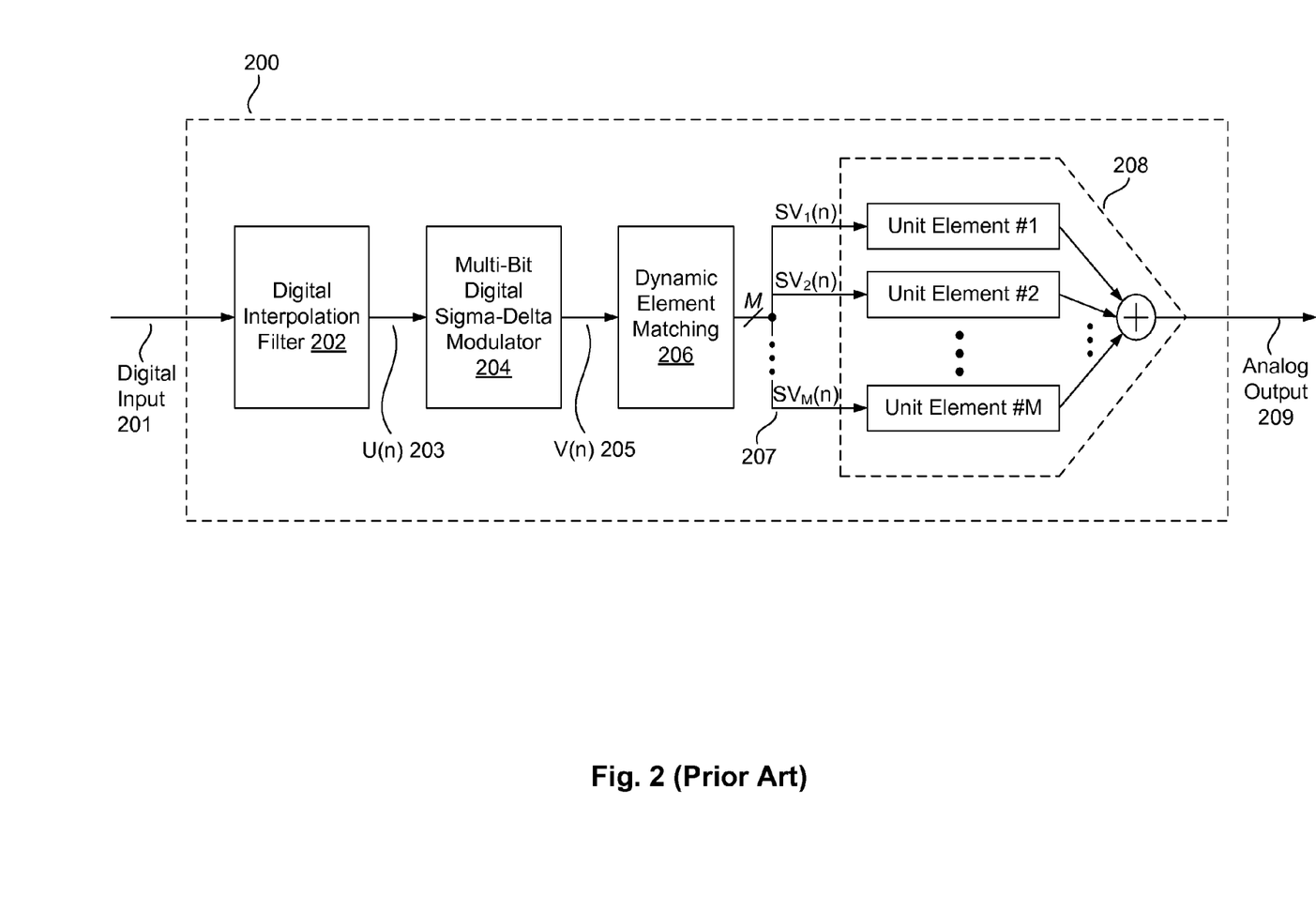
FIG. 2 illustrates a block diagram of a prior art multi-bit SD-DAC employing a multi-unit-element DAC.

FIG. 2 illustrates a block diagram of a multi-bit SD-DAC of the prior art. A multi-bit SD-DAC 200 converts a digital input signal 201 into an analog output signal 209. The multi-bit SD DAC 200 comprises a digital interpolation filter 202, a multi-bit digital sigma-delta modulator 204, a dynamic element matching block 206, and a multi-unit-element DAC 208. The multi-bit SD-DAC 200 first receives the digital input signal 201, and then interpolates the digital input signal 201 with the digital interpolation filter 202 to generate an interpolated digital signal U(n) 203, where the interpolation factor is equal to the OSR of the SD-DAC 200. The interpolated digital signal U(n) 203 is then quantized by the multi-bit digital sigma-delta modulator 204 of (M+1) levels, where M is an integer greater than or equal to two, to generate an oversampled digital signal V(n) 205. The multi-bit digital sigma-delta modulator 204 also shapes the quantization noise at the same time. The dynamic element matching block 206 and the multi-unit-element DAC 208 then convert the oversampled digital signal V(n) 205 into the final analog output signal 209.

The multi-unit-element DACs 108 and 208 use M unit elements to convert their respective thermometer-coded input control signals 107 and 207 into equivalent analog outputs 109 and 209, where each unit element acts as a unit-weight, e.g., a 1-bit sub-DAC. When a control signal $SV_k(n)=1$ for $k=1, 2, \ldots, M$, its corresponding unit element #k is selected (or activated) to contribute a fraction of 1/M to the multi-unit-element DAC's analog output. When a control signal $SV_k(n)=0$ for $k=1, 2, \ldots, M$, its corresponding unit element #k is deselected (or deactivated) to make no contribution to the multi-unit-element DAC's analog output.

Usually the unit elements of the multi-unit-element DACs 108 and 208 are designed with capacitors, resistors, or current source cells of equal value, in order to achieve a linear DAC transfer curve. However, device mismatches for the unit elements are inevitable in current integrated circuits chip fabrication processes, which causes the unit elements to contribute different values under normal working conditions. As a result, the linearity of the multi-unit-element DAC is impaired, necessitating the use of a dynamic element matching ("DEM") technique to overcome the element mismatch problem.

The DEM techniques attempt to make the long-term average use rate of each unit element in the multi-unit-element DAC the same, so that the average DAC transfer curve becomes more linear. To achieve this goal, the DEM techniques translate the respective oversampled digital signals V(n), whose value indicates how many unit elements should be selected, into an equivalent set of 1-bit control signals according to a predefined scheme, to get the unit elements selected in a pattern that can shape mismatches.

A prior art DEM technique called the data-weighted-averaging ("DWA"), disclosed by R. T. Baird and T. S. Fiez in the article of "Linearity enhancement of multi-bit delta-sigma A/D and D/A converters using data weighted averaging," IEEE Transactions on Circuits and Systems: Analog and Digital Signal Processing, vol. 42, pp. 753-762, December 1995, tries to make the long-term average use rates of all the unit elements the same by rotating the element usage pattern sequentially. However, the DWA technique only shapes the element mismatches to the first order, which limits the available improvement in the linearity of the multi-unit-element DAC. Moreover, for input signals of certain amplitudes, DWA is trapped in a periodical use of the unit elements, which incurs mismatch-induced signal-dependent tones in the analog output of the multi-unit-element DAC.

Figure 3:
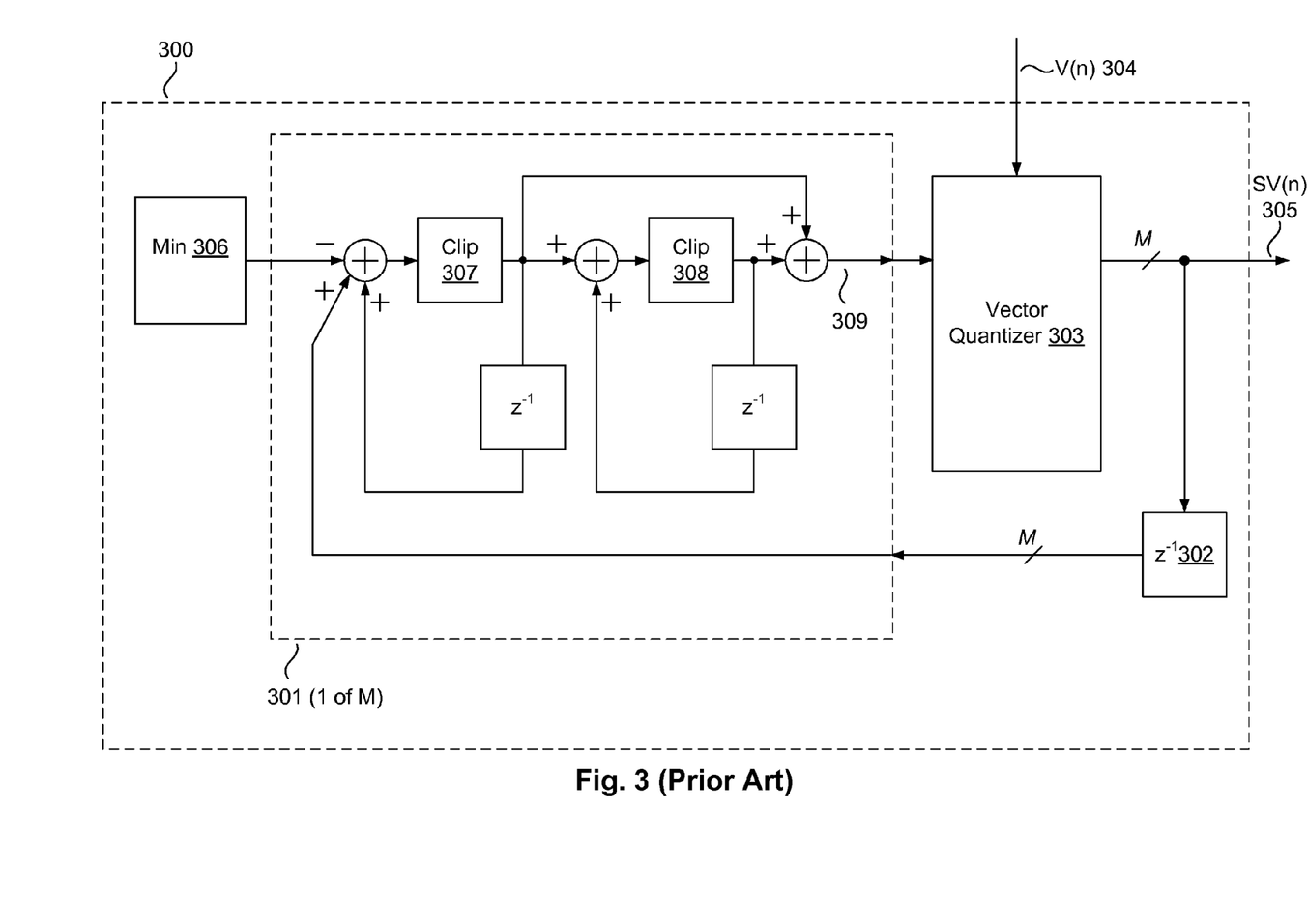
FIG. 3 illustrates a block diagram of a prior art dynamic element matching technique for shaping the element mismatches of a multi-unit-element DAC.

Another prior art DEM circuit 300, disclosed by John Laurence Melanson in the U.S. Pat. No. 6,384,761, is illustrated in FIG. 3. The DEM circuit 300 attempts 2nd-order mismatch shaping. Here, the usage histories of the unit elements are integrated with a plurality of 2nd-order low-pass digital filters 301. A vector quantizer 303 processes the filter outputs 309 and an oversampled digital input signal V(n) 304, which indicates how many unit elements should be selected digital-to-analog conversion. Firstly, the filter outputs 309 are reordered, then control signals SV(n) 305 are generated by the vector quantizer 303 to select the unit elements corresponding to the smallest V(n) filter outputs 309.

Second-order mismatch shaping can improve the linearity of the multi-unit-element DAC effectively. However, the DEM circuit 300 suffers from a stability problem since the integration results of the usage histories for the unit elements are unbounded. In particular, the integration results can keep increasing as time progresses during the digital-to-analog conversion. The key cause of the instability of the DEM circuit 300 is that its digital filters 301 directly integrate the unit element usage histories, whose long-term averages are non-zero and keep on increasing. The unbounded state variables for the digital filters 301 are especially problematic since the digital filters 301 are implemented by fixed-point arithmetic.

In order to make the state variables of the digital filters 301 bounded, a searching-for-minimum block 306 is added, which increases design complexity and implementation cost. However, the state variables of the digital filters 301 can still be found to overflow for some large input signals, which require using large word lengths and/or clip blocks 307 and 308 in the digital filters 301. Consequently, increased implementation costs and degraded mismatch shaping occur in this design.

For the foregoing reasons, there is a need for new methods and apparatuses for dynamic element matching that can shape the element mismatches to the second order with improved stability, lower design complexity, and lower implementation cost.

SUMMARY OF INVENTION

Briefly, the disclosure relates to a dynamic element matching method for a data converter, wherein the data converter having unit elements, comprising the steps of: determining an element selection probability as a function of a number of the unit elements and a digital signal; generating loop filter output signals as a function of the determined element selection probability and control signals for the unit elements; selecting certain ones of the unit elements as a function of the generated loop filter output signals; and activating the selected certain ones of the unit elements for output of the data converter.

The disclosure also relates to a dynamic element matching apparatus for shaping element mismatches of a multi-bit sigma-delta data converter, comprising, a divider; loop filters; and a vector quantizer, wherein a first input of each of the loop filters is coupled to an output of the divider, wherein a second input of each of the loop filters is coupled to an output of the vector quantizer, wherein an output of each of the loop filters is coupled to an input of the vector quantizer, wherein an input signal is coupled to an input of the divider and a second input of the vector quantizer, and wherein the input signal is indicative of a certain number of unit elements of the multi-bit sigma-delta data converter to be selected for activation.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced.

Figure 4:
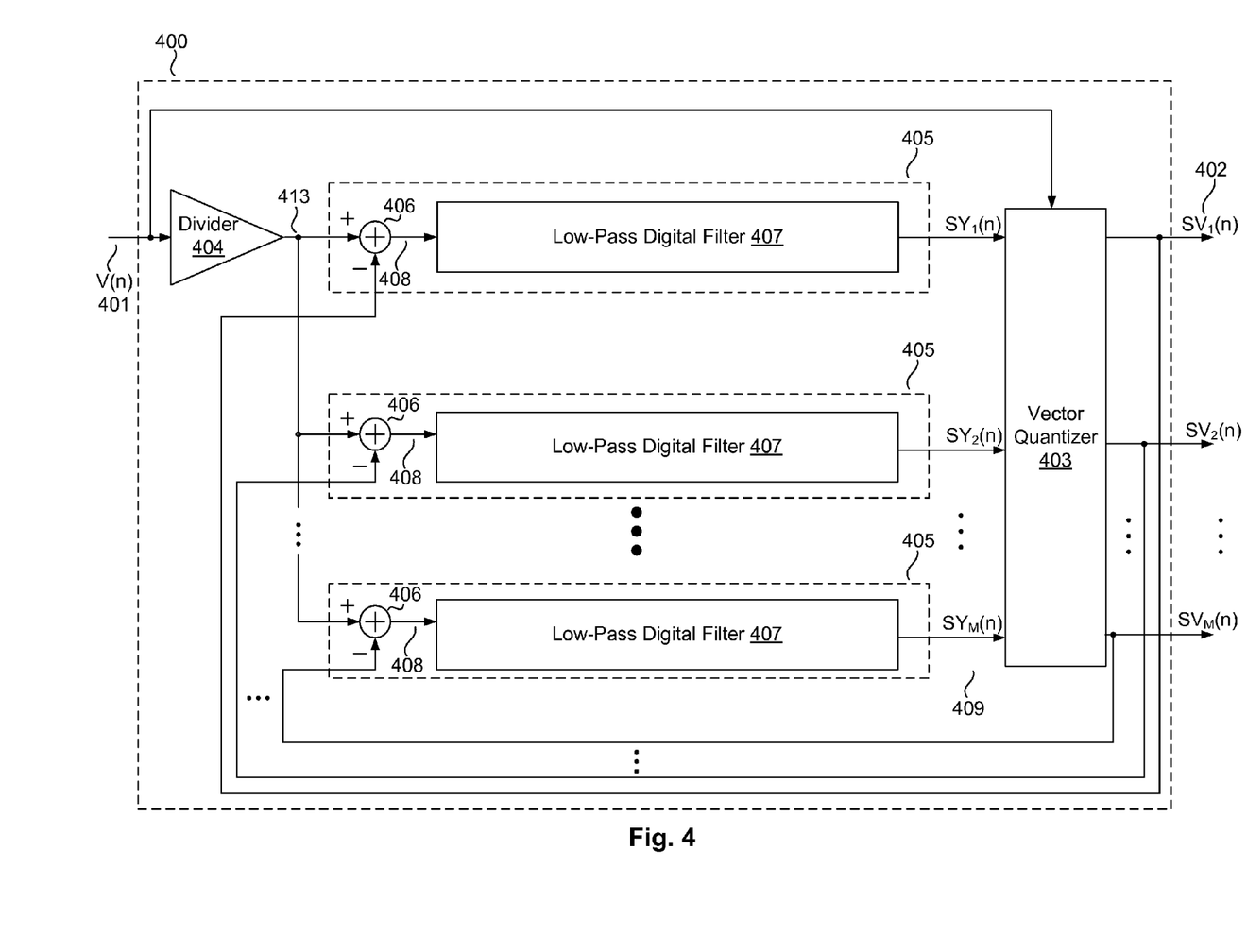
FIG. 4 illustrates a block diagram of a dynamic element matching apparatus for shaping element mismatches of a multi-unit-element DAC.

FIG. 4 illustrates a block diagram of a dynamic element matching apparatus for shaping element mismatches of a multi-unit-element DAC. The DEM apparatus 400 comprises a divider 404, mismatching loop filters 405, and a vector quantizer 403. The dynamic element matching apparatus 400 can be used for shaping the element mismatches of a multi-unit-element DAC (not shown) in a multi-bit sigma-delta data converter, e.g., a multi-bit SD-ADC or a multi-bit SD-DAC. Without loss of generality, the total number of unit elements of the multi-unit-element DAC can be equal to M, where M is an integer greater than or equal to two.

A digital input signal V(n) 401 indicates the number of unit elements of a respective multi-unit-element DAC that should be selected for digital-to-analog conversion. The digital input signal V(n) 401 is provided by the respective multi-bit sigma-delta data converter. A set of 1-bit control signals $SV_1(n)$, $SV_2(n)$, ..., $SV_M(n)$ 402 with their sum being equal to the value of the digital input signal V(n) 401 is generated by a vector quantizer 403 to control the unit element selection of the multi-unit-element DAC.

Since the multi-unit-element DAC has M unit elements, the digital input signal V(n) 401 implies that the expected element selection probability for a unit element in the multi-unit-element DAC is $$V(n)/M, \qquad \text{Equation [1]}$$

which can be implemented by the divide-by-M divider 404. Moreover, as the digital input signal V(n) 401 is an oversampled version of a low-frequency signal in both a multi-bit SD-ADC and/or a multi-bit SD-DAC, its values change slowly from sample to sample. Thus, for a segment of consecutive digital-to-analog conversion steps of the multi-unit-element DAC, the expected element selection probability of a unit element is a low-frequency signal varying slowly.

On the other hand, for Unit Element k for k=1, 2, ..., M, its corresponding control signal $SV_k(n)$ can be understood as a two-level quantization result of its expected element selection probability. For instance, in a first level, $SV_k(n)=1$ can mean the expected element selection probability of Unit Element k is quantized to 100%. In a second level, $SV_k(n)=0$ can mean the expected element selection probability of Unit Element k is quantized to 0%.

The dynamic element matching apparatus 400 further includes M mismatch-shaping loop filters 405. Each of the mismatch-shaping loop filters 405 comprises a subtracter 406 (or adder depending on the polarity of the inputs) and a low-pass digital filter 407. The calculated expected element selection probability 413 from the divider 404 can be inputted to the subtracters 406 as a reference for the respective mismatch-shaping loop filters 405. A corresponding control signal for each of the mismatch-shaping loop filters 405 is inputted to the subtracter 406 as a negative feedback input. Each of the subtracters 406 generates the element selection error 408 of its corresponding unit element by subtracting the negative feedback input from the expected element selection probability. The element selection error 408 is then processed by the low-pass digital filter 407.

The loop filter output signals $SY_k(n)$ 409 for k=1, 2, ..., M are then inputted to the vector quantizer 403. The digital input signal V(n) 401 is also directly inputted to the vector quantizer 403. The vector quantizer 403 reorders the loop filter output signals 409 in descending order, and then sets the control signals corresponding to the largest V(n) loop filter output signals to 1 and sets the remaining control signals to 0.

The generated control signals $SV_k(n)$ 402 for k=1, 2, ..., M are then outputted to select the unit elements of the multi-unit-element DAC.

By taking the control signals 402 as two-level quantization results of the expected element selection probability for each unit element, the vector quantizer 403 can be roughly modeled as a set of M two-level quantizers, where each of the two-level quantizers can have a z-domain transfer function of $$SV_k(z)=V(z)/M+SY_k(z)+SE_k(z), \quad \text{Equation [2]}$$

where $SE_k(z)$ for k=1, 2, ..., M is the element selection quantization errors accompanying the quantization operations of the vector quantizer 403. The element selection quantization errors $SE_k(z)$ can be approximated as white noise sequences bounded in the range of [−1, +1]. As a result, the dynamic element matching apparatus 400 now can be modeled as a set of M mismatch-shaping negative feedback loops having the topology of a conventional low-pass sigma-delta modulator with a direct input feed forward. If the low-pass digital filters 407 are designed to have a z-domain transfer function of $$DF(z)=1/MSF(Z)-1, \quad \text{Equation [3]}$$

where MSF(z) is the targeted high-pass mismatch-shaping function, then a loop filter output signal 409 can be expressed as $$SY_k(z)=(V(z)/M+SV_k(z))*DF(z). \quad \text{Equation [4]}$$

By substituting Equation [3] and Equation [4] into Equation [2], the z-domain transfer function of a mismatch-shaping negative feedback loop can be derived to be $$SV_k(z)=V(z)/M+MSF(z)*SE_k(z). \quad \text{Equation [5]}$$

The weight for the $k^{th}$ unit element can be defined as $U_k=\text{Uavg}+\text{Umis}_k$, where Uavg denotes the mean weight of all the unit elements of the multi-unit-element DAC and $\text{Umis}_k$ denotes the mismatch error between the weight of the $k^{th}$ unit element and the mean weight. Thus, by definition, the summation of $\text{Umis}_k$ from k=1 to M is equal to zero, i.e., $$\sum_{k=1}^{M} \text{Umis}_k = 0.$$

By applying the control signals 402 to their corresponding unit elements, the analog output signal of the multi-unit-element DAC can be expressed as $$DACout(z) = \sum_{k=1}^{M} SV_k(z)U_k =$$

$$\sum_{k=1}^{M} \left(\frac{V(z)}{M} + MSF(z)SE_k(z)\right)(Uavg + Umis)_k =$$

$$V(z)Uavg + \frac{V(z)}{M}\sum_{k=1}^{M} Umis_k + Uavg\sum_{k=1}^{M} MSF(z)SE_k(z) +$$

$$MSF(z)\sum_{k=1}^{M} SE_k(z)Umis_k = V(z)Uavg + 0 +$$

$$Uavg\sum_{k=1}^{M} MSF(z)SE_k(z) + MSF(z)\sum_{k=1}^{M} SE_k(z)Umis_k$$

Equation [6]

The first term of Equation [6] is the expected ideal analog output of the multi-unit-element DAC in response to the digital input signal V(n) 401. The second term of Equation [6] is equal to zero since, by definition, the summation of $\text{Umis}_k$ from k=1 to M is equal to zero. The third term of Equation [6] can be approximated as zero in the low-frequency zone since on the one hand the element selection quantization errors $SE_k(z)$ for k=1, 2, ..., M are approximately bounded white noise sequences, and on the other hand MSF(z) is the targeted high-pass mismatch-shaping function with an amplitude frequency response of almost zero in the low-frequency zone. The fourth term of Equation [6] illustrates that the element mismatches can be first correlated with the element selection quantization errors and then high-pass filtered by MSF(z). In effect, nonlinear errors incurred by element mismatches are now suppressed in the low-frequency zone.

One advantage of the dynamic element matching apparatus 400 is that by designing the transfer function DF(z) of the low-pass digital filters 407 properly, high-pass mismatch-shaping function MSF(z) of 1st order, 2nd order and even higher orders can be achieved, which brings greater design flexibility.

Another advantage of the dynamic element matching apparatus 400 is that its low-pass digital filters 407 are disposed in negative feedback mismatch-shaping loops to process only element selection errors 408, whose long-term averages can be zero. Therefore, the state variables of the digital filters can theoretically be bounded, so that an extra searching-for-minimum block is no longer needed.

Another advantage of the dynamic element matching apparatus 400 is that it can be modeled as a set of M mismatch-shaping negative feedback loops having the topology of a conventional low-pass sigma-delta modulator with direct input feed forward. Thus, well-studied theories and design methods of conventional low-pass sigma-delta modulators can be utilized.

Another advantage of the dynamic element matching apparatus 400 is that when M is designed to be $2^m$, wherein m=1, 2, 3, ..., the divide-by-M divider 404 can be implemented by simply reinterpreting the position of the decimal point of its input signal, which can greatly reduce implementation cost.

Figure 5:
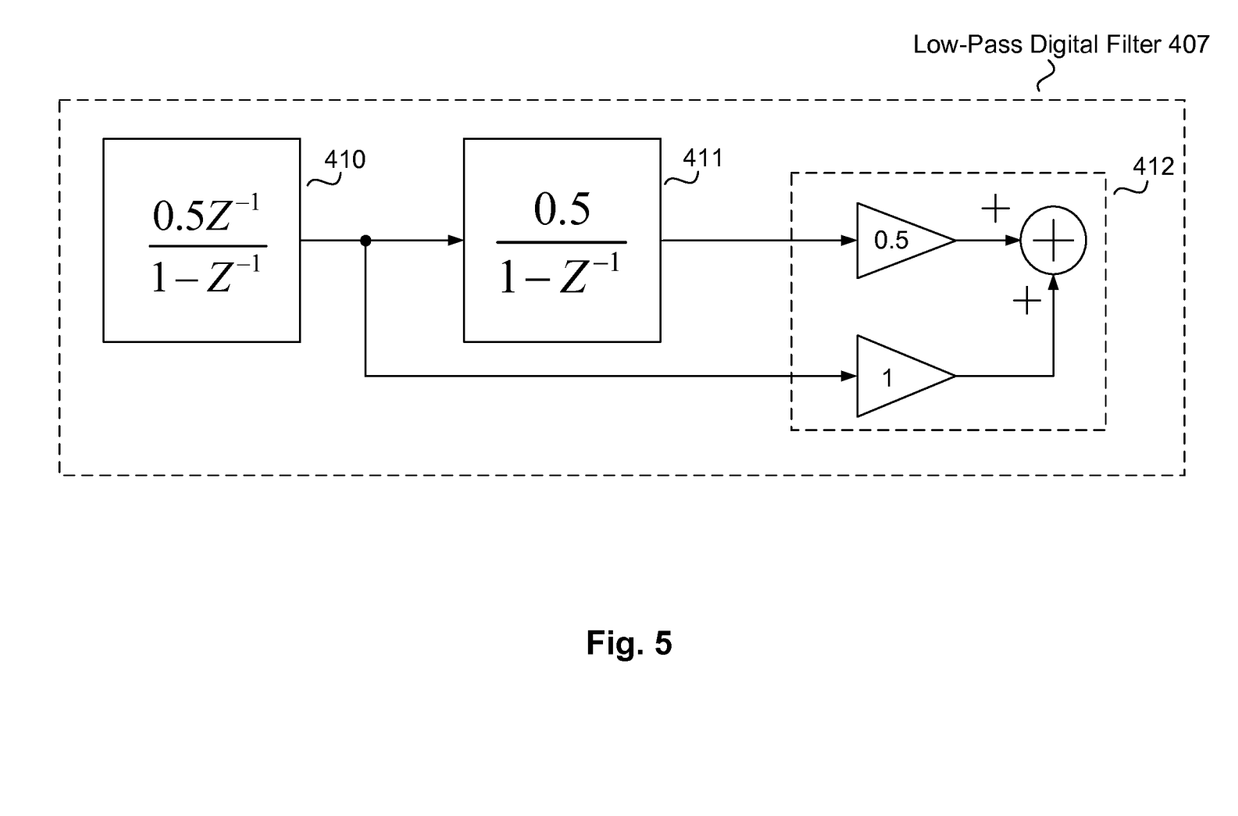
FIG. 5 illustrates a block diagram of a low-pass digital filter.

For instance, the low-pass digital filters 407 of the dynamic element matching apparatus 400 can be a $2^{nd}$-order low-pass digital filter, as shown in FIG. 5, comprising a delaying integrator 410, a non-delaying integrator 411, and an adder 412. The delaying integrator 410 with an integrator gain of 0.5 can be used to integrate the element selection error 408. The non-delaying integrator 411 with an integrator gain of 0.5 can then be used to integrate the output of the delaying integrator 410. The adder 412 is then used to add together the output of the delaying integrator 410 and the output of the non-delaying integrator 411. A first weighting factor of 1 is applied to the output of the delaying integrator 410 and a second weighting factor of 0.5 is applied to the output of the non-delaying integrator 411.

According to Equation [3], the resultant mismatch-shaping function is $$MSF(z) = \frac{(1-z^{-1})^2}{1-1.375z^{-1}+1.5z^{-2}} \quad \text{Equation [7]}$$

According to Equation [7] and the above analysis of Equation [6], the element mismatches are now high-pass filtered to the 2nd order, which is also proved by simulation results.

Thorough simulations with various input signals are also carried out to verify the stability of the dynamic element matching apparatus 400. The simulation results demonstrate that the integration results of both integrators 410 and 411 can always be bounded, which confirms the foregoing theoretical analysis. Specifically, the integration results of the delaying integrator 410 are bounded to the range of [−1,1), but the integration results of the non-delaying integrator 411 are found to extend to the range of [−32,32). If there is a further need to reduce implementation cost, the non-delaying integrator 411 can adopt a fixed-point implementation supporting a range of only [−2,2) with an extra clip block to saturate its integration results in case of overflow. The mismatch-shaping performance of the dynamic element matching apparatus 400 suffers little from the added clip block, because even when the non-delaying integrator 411 saturates occasionally, the delaying integrator 410 works normally to guarantee 1st-order mismatch shaping at least.

Figure 6:
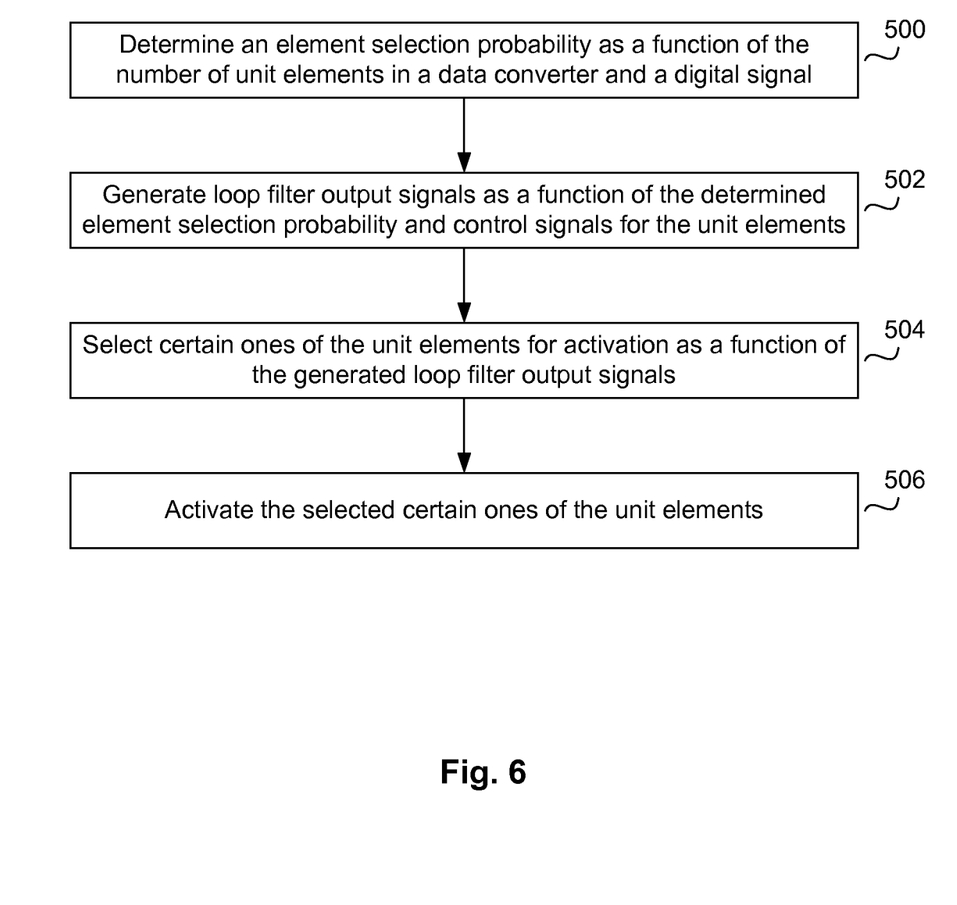
FIG. 6 illustrates a flow chart for dynamic element matching for shaping element mismatches.

FIG. 6 illustrates a flow chart for dynamic element matching to shape element mismatches of a multi-unit-element digital-to-analog converter in a multi-bit sigma-delta data converter. In order to achieve dynamic element matching, an element selection probability is determined 500 as a function of the total number of unit elements and a digital signal. The digital signal can be indicative of the number of the unit elements that need to be selected for activation. The loop filter output signals are then generated 502 as a function of the determined element selection probability and control signals to the unit elements. The control signals can be used to control the unit elements for activation or deactivation. Next, certain ones of the unit elements are selected 504 for activation as a function of the generated loop filter output signals. Lastly, the selected certain ones of the unit elements can be activated 506.

While the disclosure has been described with reference to certain embodiments, it is to be understood that the disclosure is not limited to such embodiments. Rather, the disclosure should be understood and construed in its broadest meaning, as reflected by the following claims Thus, these claims are to be understood as incorporating not only the apparatuses, methods, and systems described herein, but all those other and further alterations and modifications as would be apparent to those of ordinary skilled in the art.

We claim:

1. A dynamic element matching method for a data converter having unit elements, comprising the steps of:
    determining an element selection probability as a function of a number of the unit elements and a digital signal;
    generating loop filter output signals as a function of the determined element selection probability and control signals for the unit elements;
    selecting certain ones of the unit elements as a function of the generated loop filter output signals; and
    activating the selected certain ones of the unit elements for output of the data converter.

2. The method of claim 1 wherein in the determining step, the digital signal is divided by the number of the unit elements to determine the element selection probability signal.

3. The method of claim 1 wherein an element selection error signal is calculated for a corresponding one of the unit elements by subtracting the determined element selection probability by the respective control signal of the corresponding one of the unit elements.

4. The method of claim 3 wherein in the generating step, low pass digital filters are applied to the element selection error signal to generate loop filter output signals.

5. The method of claim 4 wherein the low pass digital filters are second-order low-pass digital filters.

6. The method of claim 5 wherein each of the low pass digital filters comprises:
    a delaying integrator, wherein the delaying integrator integrates the element selection error signal with a first integrator gain factor to generate a first output;
    a non-delaying integrator, wherein the non-delaying integrator integrates the first output with a second integrator gain factor to generate a second output; and
    an adder, wherein the adder generates one of the loop filter output signals by applying a first weighting factor to the first output and applying a second weighting factor to the second output, then summing the weighted first output and the weighted second output.

7. The method of claim 6 wherein the non-delaying integrator has a clip block that saturates the non-delaying integrator for overflow cases.

8. The method of claim 1 wherein the digital signal has a predefined value and wherein in the selecting step, a predefined number of the unit elements are selected to correspond to the predefined value.

9. The method of claim 8 wherein each of the loop filter output signals correspond to one of the unit elements and wherein the selected unit elements have largest corresponding values of the loop filter output signals.

10. A dynamic element matching circuit for shaping element mismatches of a multi-bit sigma-delta data converter, comprising,
    a divider;
    loop filters; and
    a vector quantizer,
    wherein a first input of each of the loop filters is coupled to an output of the divider,
    wherein a second input of each of the loop filters is coupled to an output of the vector quantizer,
    wherein an output of each of the loop filters is coupled to an input of the vector quantizer, wherein an input signal is coupled to an input of the divider and a second input of the vector quantizer, and
    wherein the input signal is indicative of a certain number of unit elements of the multi-bit sigma-delta data converter to be selected for activation.

11. The dynamic element matching apparatus of claim 10 wherein each of the loop filters comprises a subtracter and a certain low pass digital filter.

12. The dynamic element matching apparatus of claim 11 wherein for each of the loop filters, the first input and the second input are inputted to the subtracter, an output of the subtracter is coupled to the certain low pass digital filter, and an output of the certain low pass digital filter is coupled to a certain input of the vector quantizer.

13. The dynamic element matching apparatus of claim 10 wherein the divider divides the input signal by the total number of the unit elements.

14. A dynamic element matching method for shaping element mismatches of a multi-bit sigma-delta data converter having unit elements, comprising the steps of:
    determining an element selection probability as a function of a number of the unit elements and a digital signal;
    generating loop filter output signals as a function of the determined element selection probability and control signals for the unit elements, wherein an element selection error signal is calculated for a corresponding one of the unit elements by subtracting the determined element selection probability by the respective control signal of the corresponding one of the unit elements and wherein low pass digital filters are applied to the element selection error signal to generate one of the loop filter output signals;

selecting certain ones of the unit elements as a function of the generated loop filter output signals; and activating the selected certain ones of the unit elements for output of the data converter.

15. The method of claim 14 wherein in the determining step, the digital signal is divided by the number of the unit elements to determine the element selection probability signal.

16. The method of claim 14 wherein the low pass digital filters are second-order low-pass digital filters.

17. The method of claim 14 wherein each of the low pass digital filters comprises:

a delaying integrator, wherein the delaying integrator integrates the element selection error signal with a first integrator gain factor to generate a first output;

a non-delaying integrator, wherein the non-delaying integrator integrates the first output with a second integrator gain factor to generate a second output; and an adder, wherein the adder generates one of the loop filter output signals by applying a first weighting factor to the first output and applying a second weighting factor to the second output, then summing the weighted first output and the weighted second output.

18. The method of claim 17 wherein the non-delaying integrator has a clip block that saturates the non-delaying integrator for overflow cases.

19. The method of claim 14 wherein the digital signal has a predefined value and wherein in the selecting step, a predefined number of the unit elements are selected to correspond to the predefined value.

20. The method of claim 19 wherein each of the loop filter output signals corresponds to one of the unit elements and wherein the selected unit elements have largest corresponding values of the loop filter output signals.

* * * * *